(12) United States Patent
Li et al.

(10) Patent No.: US 12,744,533 B2
(45) Date of Patent: Sep. 22, 2026

(54) PULSE GENERATION CIRCUIT

(71) Applicant: Nuvoton Technology Corporation, Hsinchu Science Park (TW)

(72) Inventors: Cheng-Tao Li, Hsinchu Science Park (TW); Hao Li, Hsinchu City (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 19/197,310

(22) Filed: May 2, 2025

(65) Prior Publication Data

US 2025/0364975 A1 Nov. 27, 2025

(30) Foreign Application Priority Data

May 22, 2024 (TW) ................................ 113118880

(51) Int. Cl.
*H03L 7/06* (2006.01)
*H03L 7/02* (2006.01)

(52) U.S. Cl.
CPC . *H03L 7/06* (2013.01); *H03L 7/02* (2013.01)

(58) Field of Classification Search
CPC ................ H03L 7/00; H03L 7/02; H03L 7/06
See application file for complete search history.

(56) References Cited

U.S. PATENT DOCUMENTS

| | | | |
|---|---|---|---|
| 5,594,388 A | 1/1997 | O'Shaughnessy et al. | |
| 9,503,106 B1 * | 11/2016 | Ding | H03L 7/00 |
| 2007/0099581 A1 | 5/2007 | Liu | |
| 2019/0235566 A1 | 8/2019 | Ensafdaran | |
| 2020/0313616 A1 | 10/2020 | Tsuji | |

FOREIGN PATENT DOCUMENTS

| | | |
|---|---|---|
| CN | 107017880 A | 8/2017 |
| JP | 2011-223375 A | 11/2011 |

* cited by examiner

*Primary Examiner* — Ryan Johnson
(74) *Attorney, Agent, or Firm* — MUNCY, GEISSLER, OLDS & LOWE, P.C.

(57) ABSTRACT

A pulse generation circuit is provided. The pulse generation circuit includes a reference voltage generator, a pulse generator, a comparator, a voltage regulator, a voltage-controlled oscillator (VCO), and a frequency divider. The reference voltage generator generates a reference signal. The pulse generator generates a pulse signal according to the frequency division signal. The comparator receives and compares the reference signal and the pulse signal to output a comparison signal. When the pulse signal and the reference signal have the same voltage level, the comparator outputs the comparison signal with a low logic level. The voltage regulator receives the comparison signal and the frequency division signal outputs a voltage signal correspondingly. The VCO receives the voltage signal and outputs an oscillation signal correspondingly, and the frequency divider divides the oscillation signal to generate the frequency division signal.

10 Claims, 5 Drawing Sheets

PULSE GENERATION CIRCUIT

CROSS REFERENCE TO RELATED APPLICATIONS

This application claims priority of Taiwan Patent Application No. 113118880, filed on May 22, 2024, the entirety of which is incorporated by reference herein.

BACKGROUND OF THE INVENTION

Field of the Invention

The present invention relates to a pulse generation circuit, and, in particular, to a pulse generation circuit that can adjust the output signal of a voltage-controlled oscillator.

Description of the Related Art

A voltage-controlled oscillator (VCO) is a circuit that controls the oscillation frequency through the voltage of an input signal. To enable the VCO to output the required frequency, or to have a wide range of output frequencies, the voltage of the input signal can be adjusted before inputting to the VCO.

However, traditional oscillators are very sensitive to component aging, delay, flicker noise, etc., but oscillators with high stability and accuracy usually require high power consumption. Therefore, to balance stability, accuracy and low power consumption, a new circuit design is needed.

BRIEF SUMMARY OF THE INVENTION

An embodiment of the present invention provides a pulse generation circuit, comprising a reference voltage generator, a pulse generator, a comparator, a voltage regulator, a voltage-controlled oscillator, and a frequency divider. The reference voltage generator is configured to generate a reference signal, the pulse generator is configured to generate a pulse signal based on a frequency division signal. The comparator is configured to receive and compare the reference signal and the pulse signal, and outputs a comparison signal. The comparator outputs the comparison signal with a logic low level when the voltage level of the pulse signal has the same voltage level as the reference signal. The voltage regulator is configured to receive the comparison signal and the frequency division signal, and outputs a voltage signal correspondingly. The voltage-controlled oscillator is configured to receive the voltage signal, and outputs an oscillator signal correspondingly. The frequency divider is configured to generate a frequency division signal based on the oscillation signal.

An embodiment of the present invention provides the voltage regulator comprising a second capacitor, a first current source, and a second current source. The first current source is configured to receive the comparison signal, and when the comparison signal is at a logic high level, the first current source increases the current flowing through the second capacitor. The second current source is configured to receive the frequency division signal, and when the frequency division signal is at a logic high level, the second current source decreases the current flowing through the second capacitor. A level of the voltage signal is determined by an intensity of the current flowing through the second capacitor.

Another embodiment of the present invention provides the voltage regulator comprising a first average voltage generation circuit, a second average voltage generation circuit, and a voltage processing circuit. The first average voltage generation circuit is configured to receive the comparison signal and to calculate the average voltage of the comparison signal. The second average voltage generation circuit is configured to receive the frequency division signal and to calculate the average voltage of the frequency division signal. The voltage processing circuit is configured to receive the average voltages of the comparison signal and the frequency division signal, and to output the voltage signal correspondingly. The difference between the average voltage of the comparison signal and the average voltage of the frequency division signal determines the level of the voltage signal.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In order to make the above and other objects, features, and advantages of the present invention more clearly understood, preferred embodiments specially cited below and described in detail with the attached drawings.

Some embodiments summarized below to make it easier for a person skilled in the art easily understand the embodiments of the present invention. However, these embodiments are merely examples and not used to limit the embodiments of the present invention. It is to be understood that a person skilled in the art can adjust the embodiments described below as needed. For example, changing the process sequence and/or including more or fewer steps than those described here, and these adjustments are not exceed the scope of the embodiments of the present invention.

A phase-locked loop (PLL) is a feedback circuit that can include a phase/frequency detector, a filter, and an oscillator. Phase-locked loop uses feedback control principles to achieve frequency and/or phase control, so that the output signal of the circuit can be synchronized with an external reference signal. When the output frequency or phase changes, the phase/frequency detector can detect the above changes, and adjust the frequency and/or phase of the output signal through an internal feedback system until the output signal is synchronized with the reference signal again.

Figure 1:
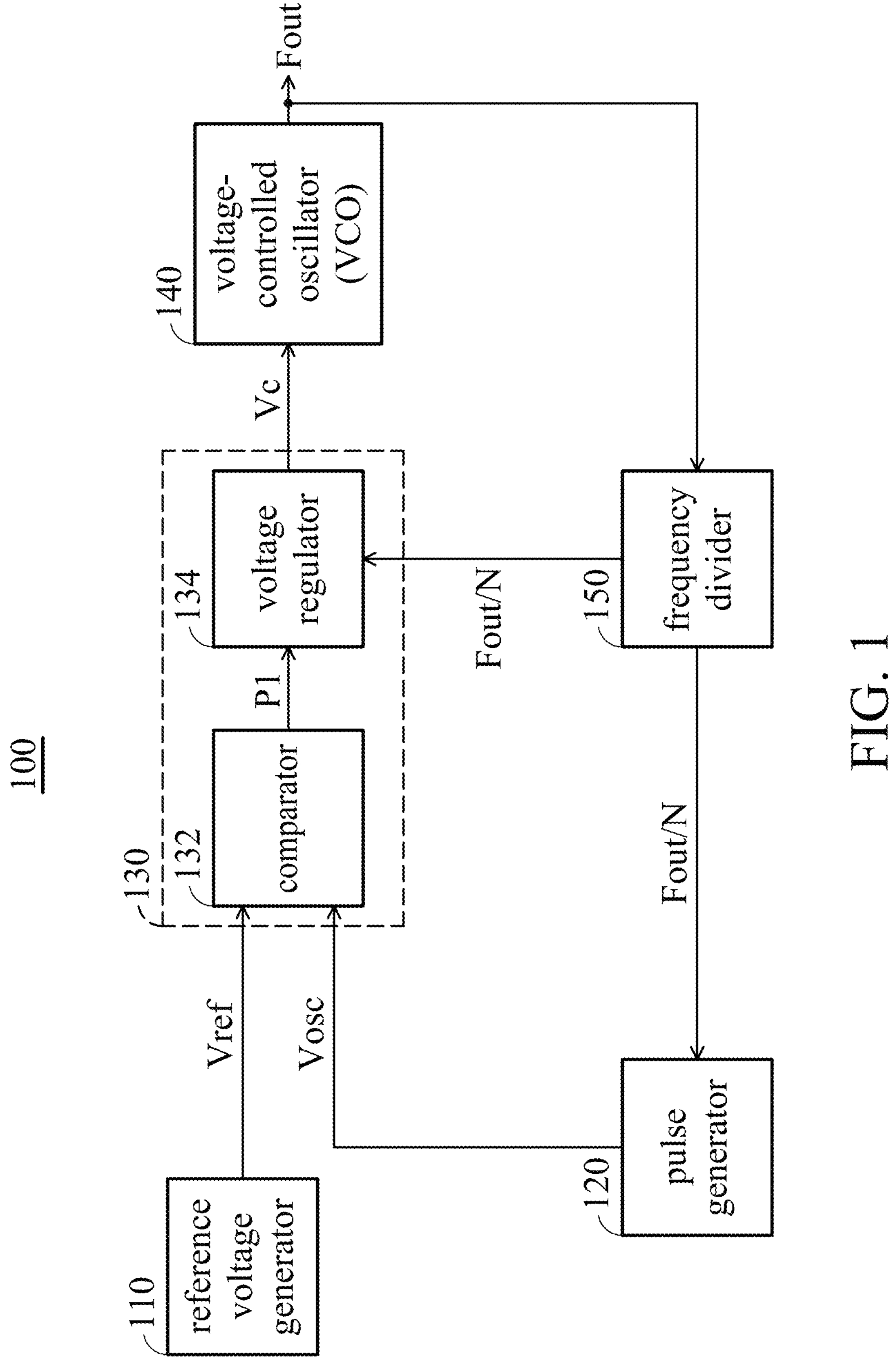
FIG. 1 shows a pulse generation circuit according to an embodiment of the present disclosure.

FIG. 1 shows a pulse generation circuit 100 according to an embodiment of the present disclosure, including a reference voltage generator 110, a pulse generator 120, a frequency-to-voltage converter 130, a voltage-controlled oscillator (VCO) 140, and a frequency divider 150. The reference voltage generator 110 is configured to generate a reference signal Vref and output it to the frequency-to-voltage converter 130. The pulse generator 120 is configured to generate a pulse signal Vosc and output it to the frequency-to-voltage converter 130. The frequency-to-voltage converter 130 generates a voltage signal Vc based on the reference signal Vref, the pulse signal Vosc and a frequency division signal Fout/N from the frequency divider 150.

The frequency-to-voltage converter 130 can further include a comparator 132 and a voltage regulator 134. The comparator 132 is configured to receive and compare the reference signal Vref and the pulse signal Vosc, and to generate a comparison signal P1 based on the comparison result. The voltage regulator 134 is configured to receive the comparison signal P1 and the frequency division signal Fout/N, and to output the corresponding voltage signal Vc to the VCO 140 based on the comparison signal P1 and the frequency division signal Fout/N. After receiving the voltage signal Vc, the VCO 140 generates an oscillation signal Fout and outputs it to the frequency divider 150. The frequency divider 150 generates a frequency division signal Fout/N based on the oscillation signal Fout, and outputs it to the frequency-to-voltage converter 130 and the pulse generator 120 to adjust the voltage signal Vc and the pulse signal Vosc.

During the initialization phase of the pulse generation circuit 100, a preset voltage signal Vc is provided to the VCO 140, so that the VCO 140 generates a preset oscillation signal Fout based on the preset voltage signal Vc, and outputs it to the frequency divider 150. The frequency divider 150 divides the preset oscillation signal Fout by N (N is a positive integer) to generate the preset frequency division signal Fout/N, and outputs it to the pulse generator 120 and the voltage regulator 134. The pulse generator 120 generates a preset pulse signal Vosc based on the frequency of the preset frequency division signal Fout/N, and outputs it to the comparator 132 for comparison with the reference signal Vref.

The comparator 132 generates the comparison signal P1 based on the comparison result and outputs it to the voltage regulator 134. The voltage regulator 134 generates a new voltage signal Vc (e.g., it can be different from the preset voltage signal Vc) and outputs it to the VCO 140. The VCO 140 receives the new voltage signal Vc, and generates a new oscillation signal Fout based on the new voltage signal Vc. After receiving the new oscillation signal Fout, the frequency divider 150 divides the new oscillation signal Fout by N to generate a new frequency division signal Fout/N, and outputs it to the pulse generator 120 and the voltage regulator 134 to initiate the next voltage and frequency adjustment.

It should be cared that the comparator 132 can be a chopped comparator to reduce or eliminate the impact of the input offset on the circuit operation, but the present disclosure is not limited thereto. Additionally, the frequency divider 150 can divide the oscillation signal Fout by N times, where N can be any positive integer, so that the pulse generation circuit 100 can provide a broader range of the frequency domain for a connected system to operate.

Figure 2:
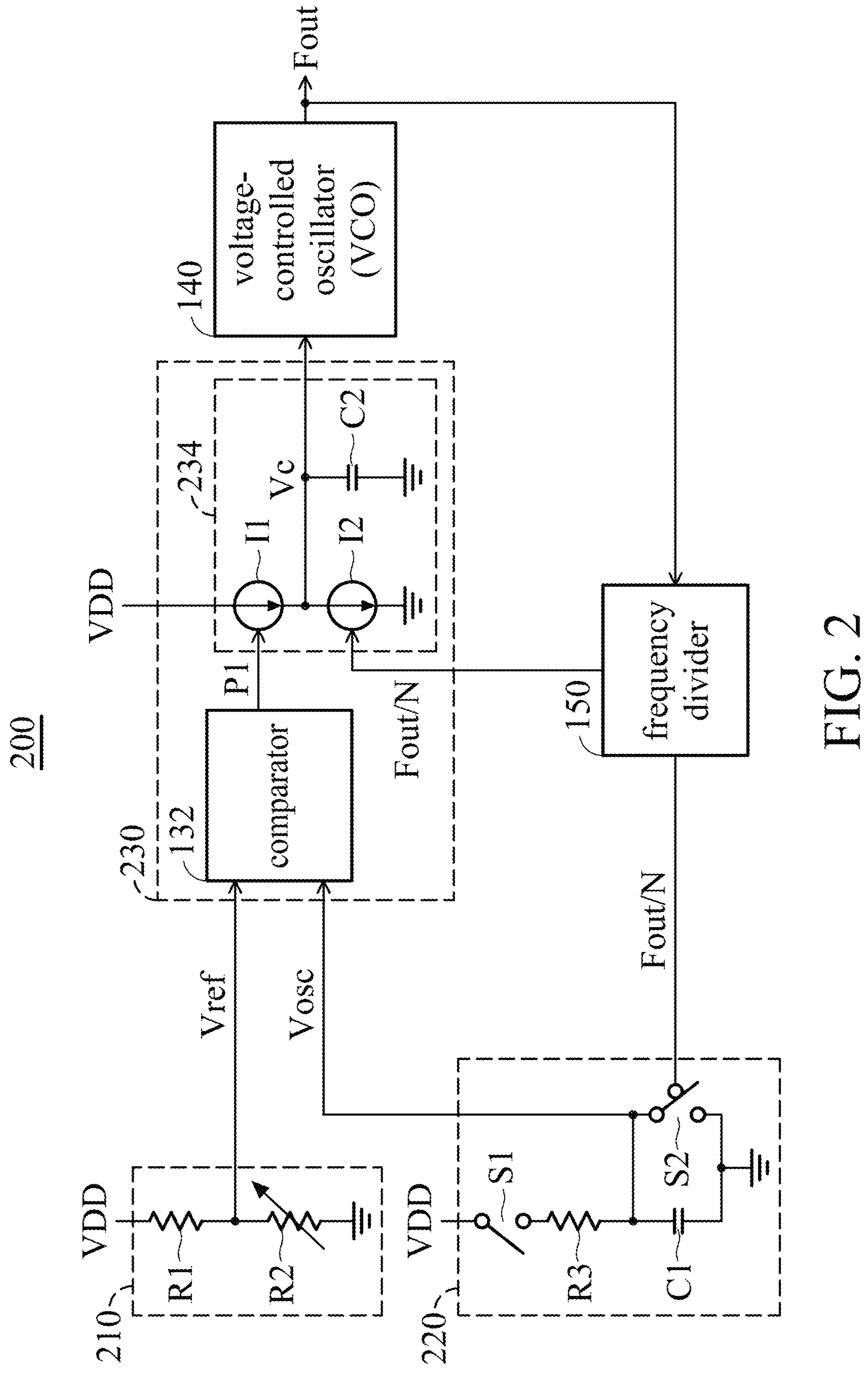
FIG. 2 shows a pulse generation circuit according to an embodiment of the present disclosure.
Figure 3:
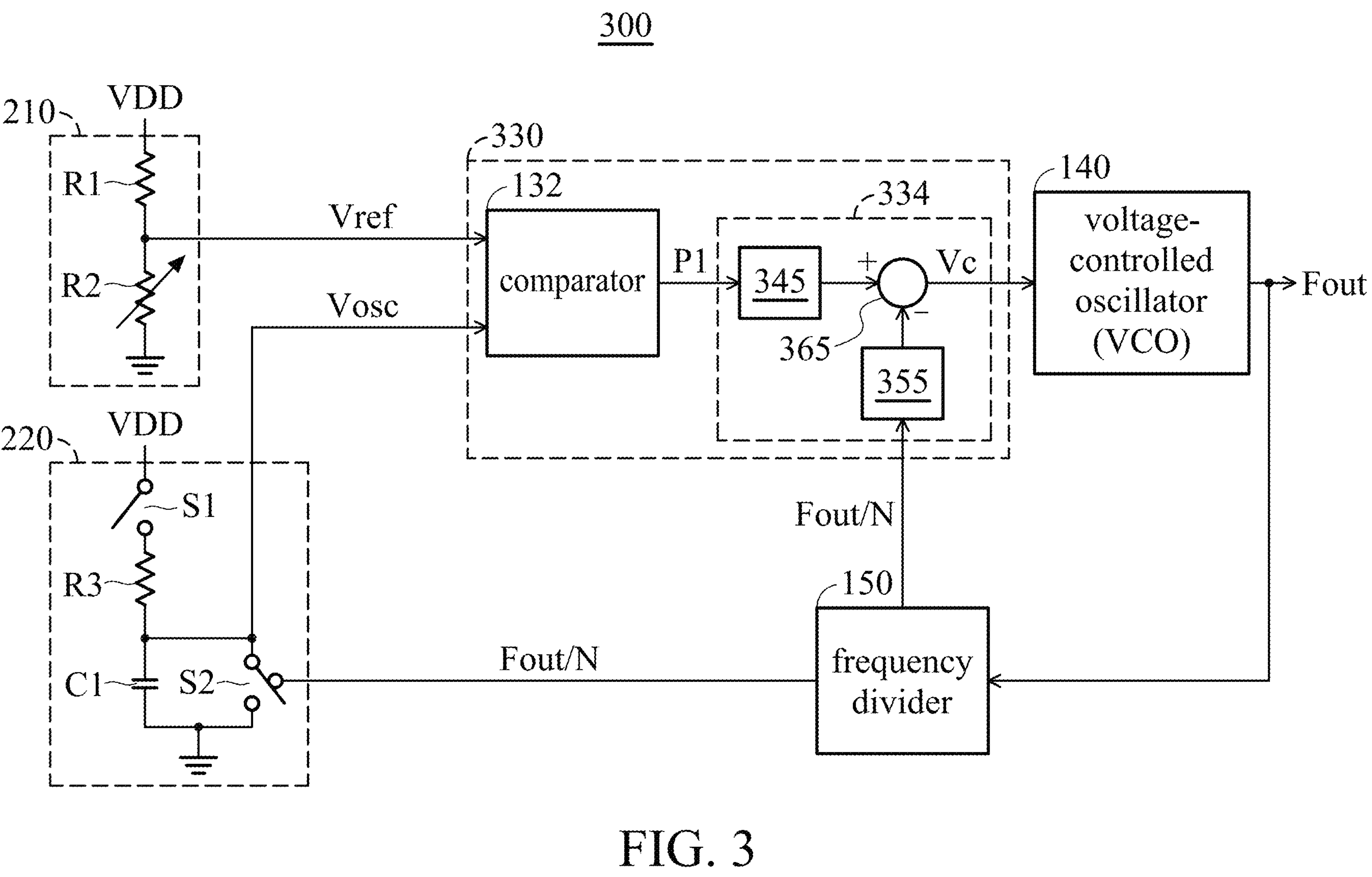
FIG. 3 shows a pulse generation circuit according to an embodiment of the present disclosure.

FIG. 2 and FIG. 3 respectively show a pulse generation circuit 200 and a pulse generation circuit 300 described according to an embodiments of the present disclosure. The pulse generation circuit 200 includes a reference voltage generator 210, a pulse generator 220, a frequency-to-voltage converter 230, the VCO 140 and the frequency divider 150. The frequency-to-voltage converter 230 further includes the comparator 132 and a voltage regulator 234. The reference voltage generator 210 includes resistors R1 and R2, the pulse generator 220 includes switches S1 and S2, a resistor R3 and a capacitor C1. The voltage regulator 234 includes current sources I1 and 12 and a capacitor C2. The operation and connection relationship of the comparator 132, the VCO 140 and the frequency divider 150 are similar to that of the comparator 132, the VCO 140 and the frequency divider 150 in the pulse generation circuit 100 shown in FIG. 1 and not repeated herein.

The reference voltage generator 210 uses the resistors R1 and R2 to divide a power supply voltage VDD to generate the reference signal Vref. One end of the resistor R1 is connected to the power supply voltage VDD, and the resistor R2 is coupled between the other end of the resistor R1 and a ground terminal. In addition, the resistor R2 can be a variable resistor for adjusting the voltage level of the reference signal Vref, but the disclosure is not limited thereto. The pulse generator 220 is configured to receive the frequency division signal Fout/N through the switches S1 and S2. One end of the switch S1 is connected to the power supply voltage VDD, the other end is connected to one end of the resistor R3. The capacitor C1 and the switch S2 are connected between the other end of resistor R3 and the ground terminal. When the switch S1 is turned on, the switch S2 will be turned off so that the power supply voltage to charge the capacitor C1 through the resistor R3. When the switch S2 is turned on, the switch S1 will be turned off so that the cross-voltage on the capacitor C1 is released to prepare for the next charge. The pulse generator 220 can generate the pulse signal Vosc corresponding to the frequency division signal Fout/N through the above operation of the switches S1 and S2.

The comparator 132 receives the reference signal Vref and the pulse signal Vosc and generates the comparison signal P1, and outputs the comparison signal P1 to the current source I1 to control the turn-on time of the current source I1. At the same time, the frequency divider 150 outputs the frequency division signal Fout/N to the current source I2 to control the turn-on time of the current source I2. The cross-voltage (i.e., the voltage signal Vc) on the capacitor C2 is controlled by controlling the turn-on time of the current sources I1 and I2, so that the level of the voltage signal Vc received by the VCO 140 is controlled and adjusted to achieves the purpose of controlling and adjusting the oscillation signal Fout. Finally, the frequency divider 150 receives the adjusted oscillation signal Fout, and outputs the divided frequency signal Fout/N that are used for the next adjustment to the pulse generator 220 and the voltage regulator 234.

Refer to FIG. 3, the pulse generation circuit 300 includes the reference voltage generator 210, a pulse generator 220 a frequency-to-voltage converter 330, the VCO 140 and the frequency divider 150. The operation and connection relationship of the reference voltage generator 210, the pulse generator 220, the VCO 140 and the frequency divider 1 50 of the pulse generation circuit 300 are similar to the components with the same reference signs in the pulse generation circuit 200, and not repeated herein. The difference between the pulse generation circuit 300 and the pulse generation circuit 200 is that the frequency-to-voltage converter 330 includes the comparator 132, the average voltage generation circuits 345 and 355, and a voltage processing circuit 365.

The average voltage generation circuit 345 is configured to generate the average voltage of the comparison signal P1. The average voltage generation circuit 355 is configured to generate the average voltage of the frequency division signal Fout/N. The voltage processing circuit 365 is configured to receive the average voltages generated by the average voltage generation circuits 345 and 355, to perform operations (e.g., comparison or arithmetic operations) on produce the voltage signal Vc and to output it to the VCO 140. The average voltage generation circuits 345 and 355 can be integrators, resistor-capacitor circuits, or other circuits capable of generating average voltages. The voltage processing circuit 365 can be a comparator, an operational amplifier, or other circuits capable of comparing or operating of the voltage.

Figure 4:
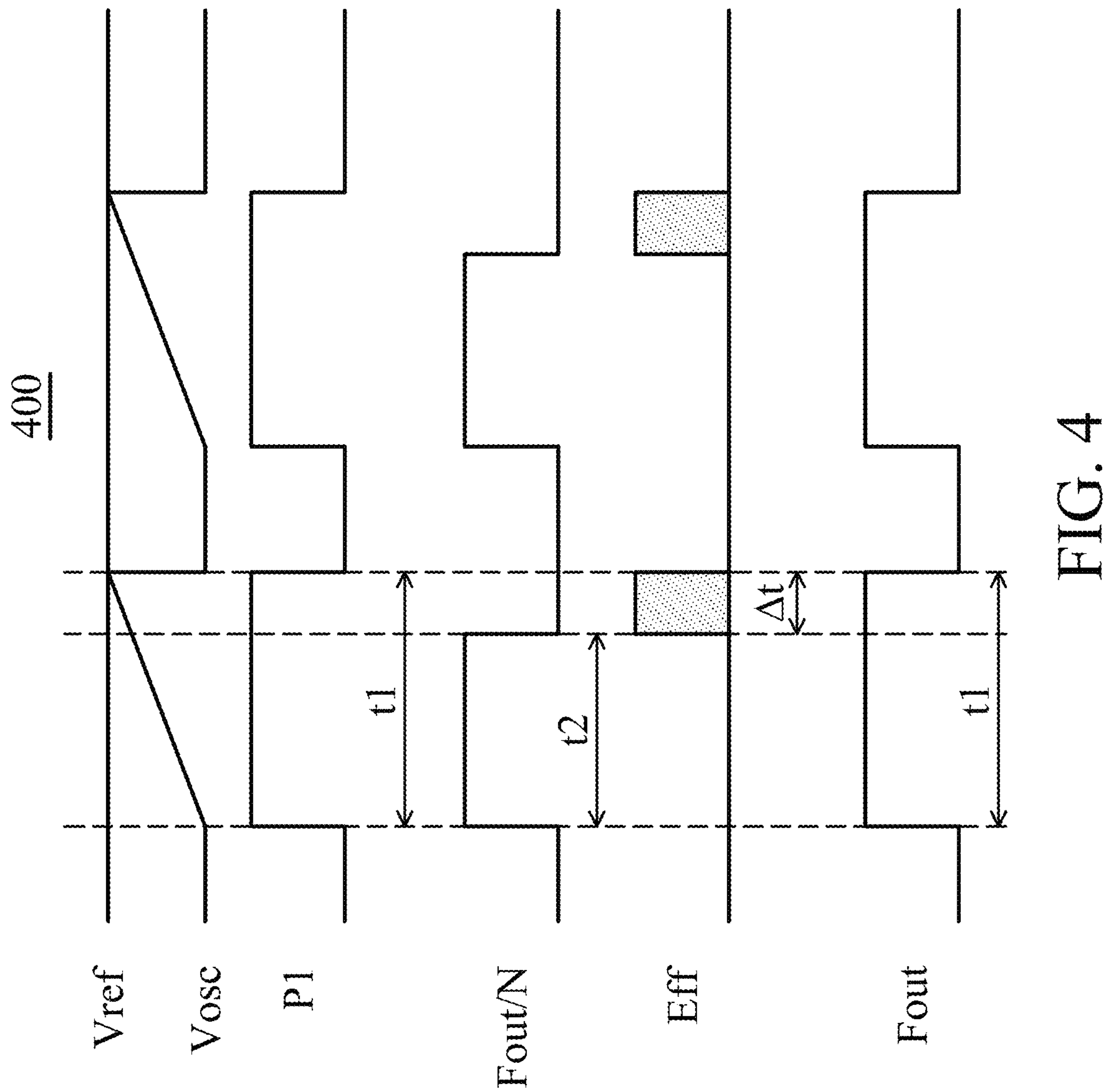
FIG. 4 shows a pulse diagram according to the embodiment of the present invention.
Figure 5:
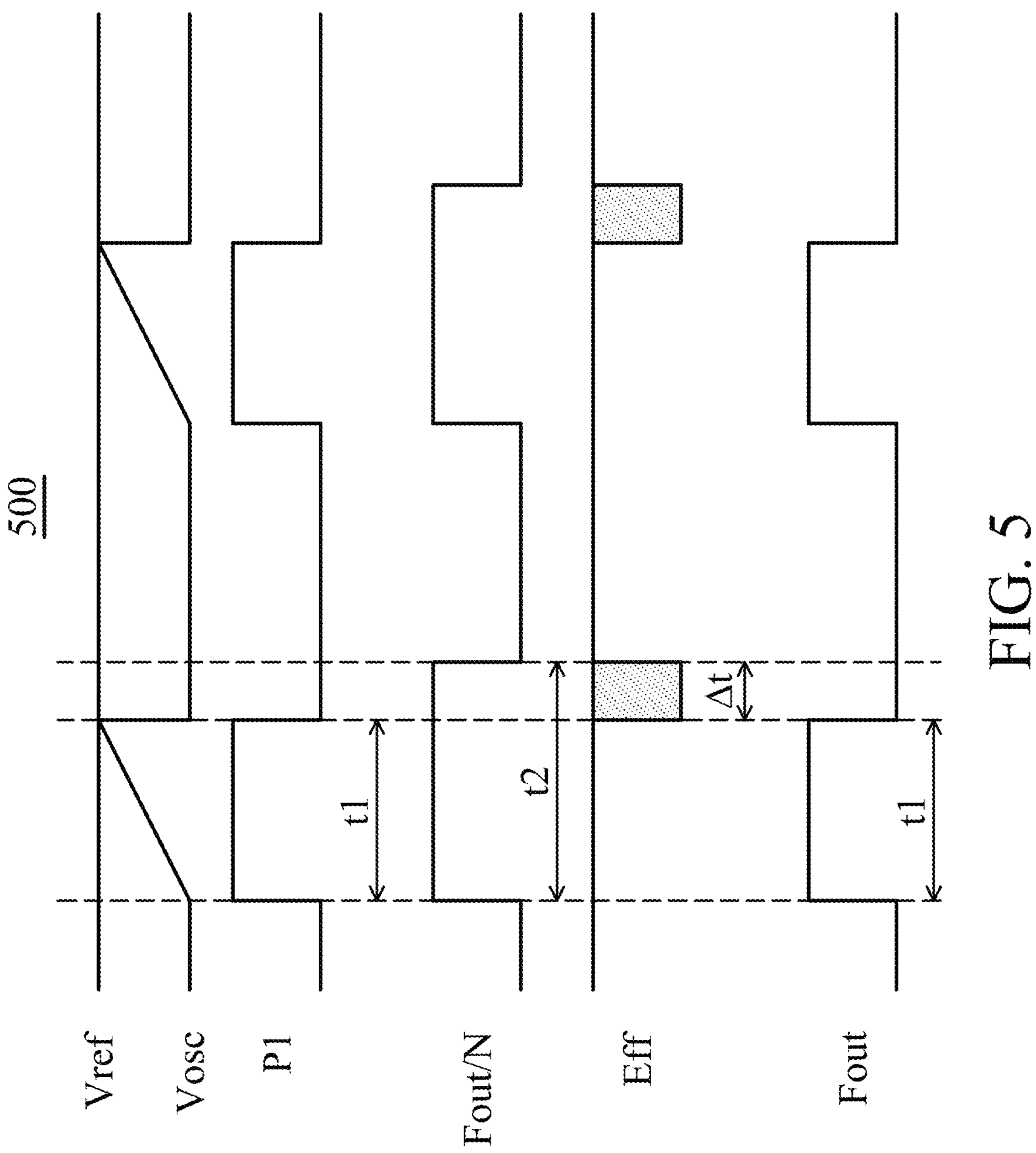
FIG. 5 shows a pulse diagram according to the embodiment of the present invention.

FIG. 4 and FIG. 5 are complex pulse diagrams described according to the embodiments of the present invention. Taking the pulse generation circuit 200 shown in FIG. 2 as an example, the circuit operations are described in detail with the pulse diagrams 400 and 500 shown in FIG. 4 and FIG. 5. As shown in FIG. 4, the comparison signal P1 and the reference signal Vref are at the logic high level, and the pulse signal Vosc is at the logic low level in the initial state of each adjustment. At the time, the frequency divider divides the frequency of the oscillation signal Fout generated by the preset voltage signal Vc, and outputs the frequency division signal FoutN to the pulse generator 220, so that the pulse signal Vosc rises with time. The comparator 132 is converted to output the comparison signal P1 with a logic low level when the voltage level of the pulse signal Vosc rises to the same voltage level as the reference signal Vref. Therefore, the duty cycles of the comparison signal P1 and the pulse signal Vosc are both the time t1, the length of the turn-on time of the current source I1 is also the time t1. Assuming the duty cycle of the frequency division signal FoutN at this time is the time t2, so that the turn-on time of the current source I2 is also the time t2.

When the time t1 is longer than the time t2 (as shown in FIG. 4), it means that the duty cycle of the frequency division signal Fout/N (or oscillator signal Fout) is shorter than the target duty cycle (i.e., the duty cycle of the comparison signal). At the time, the time (i.e., the time to charge the capacitor C2, which can be said the time to increase the current flowing through the capacitor C2) for comparison signal P1 to turn on the current source I1 is longer than the time (i.e., the time to discharge the capacitor C2, which can be said the time to reduce the current flowing through the capacitor C2) for the frequency division signal Fout/N to turn on the current source I2. Hence, the level of the voltage signal Vc is rising, thereby causing the duty cycle oscillator signal Fout output by the VCO 140 to increase to be the same as the target duty cycle. The above operation is equivalent to adding an equivalent signal Eff having the duty cycle of a time Δt to the frequency division signal Fout/N, as shown in FIG. 4.

In contrast, when the time t1 is shorter than the time t2 (as shown in FIG. 5), it means that the duty cycle of the frequency division signal Fout/N (or the oscillator signal Fout) is longer than the target duty cycle (i.e., the duty cycle of the comparison signal P1). At the time, the time for the comparison signal P1 to turn on the current source I1 (i.e., the time to charge the capacitor C2) is shorter than the time for the frequency division signal Fout/N to turn on the current source I2 (i.e., the time to discharge the capacitor C2). Hence, the level of the voltage signal Vc drops, thereby causing the of the duty cycle of the oscillator signal Fout output by the VCO 140 to be reduce to the same as the target duty cycle. The above operation is equivalent to subtracting an equivalent signal Eff having the duty cycle of the time Δt to the frequency division signal Fout/N, as shown in FIG. 5.

Taking the pulse generation circuit 300 shown in FIG. 3 as an example, the circuit operations are described in detail with the pulse diagrams 400 and 500 shown in FIG. 4 and FIG. 5. In the initial state of each adjustment, the comparison signal P1 is at logic high level, the pulse signal Vosc is at logic low level, and the comparator 132 outputs the logic low level comparison signal P1 while the pulse signal Vosc rises to the same voltage level as the reference signal Vref. Assuming the duty cycle of the comparison signal P1 is time t1, so that the duty cycle of the frequency division signal Fout/N at this time is the time t2.

As shown in FIG. 4, when the time t1 is longer than the time t2, it means that the duty cycle of the frequency division signal Fout/N (or the oscillator signal Fout) is shorter than the target duty cycle (i.e. the duty cycle of the comparison signal P1). At the time, the duty cycle of the comparison signal P1 is longer than the duty cycle of the frequency division signal Fout/N. The average voltage of the comparison signal P1 generated by the average voltage generation circuit 345 is longer than the average voltage of the frequency division signal Fout/N generated by the average voltage generation circuit 355. Hence, the voltage signal Vc generated by the voltage processing circuit 365 after comparing or operating rises, thereby causing the duty cycle of the oscillator signal Fout output by the VCO 140 to increase to the same as the target duty cycle. The above operation is equivalent to adding an equivalent signal Eff having the duty cycle of the time Δt to the frequency division signal Fout/N, as shown in FIG. 4.

In contrast, as shown in FIG. 5, when the time t1 is shorter than the time t2, it means that the duty cycle of the frequency division signal Fout/N (or the oscillator signal Fout) is longer than the target duty cycle (i.e. the duty cycle of the comparison signal P1). At the time, the duty cycle of the comparison signal P1 is shorter than the duty cycle of the frequency division signal Fout/N. The average voltage of the comparison signal P1 generated by the average voltage generation circuit 345 is shorter than the average voltage of the frequency division signal Fout/N generated by the average voltage generation circuit 355. Hence, the voltage signal Vc generated by the voltage processing circuit 365 after comparing or operating drops, thereby causing the duty cycle of the oscillator signal Fout output by the VCO 140 to decrease to the same as the target duty cycle. The above operation is equivalent to subtracting an equivalent signal Eff having the duty cycle of the time Δt to the frequency division signal Fout/N, as shown in FIG. 5.

Through the above operation, the pulse generation circuit 200 can control the current source I1 and I2 to change the level of the voltage signal through the comparison signal P1 and the frequency division signal Fout/N, thereby achieving the effect of controlling and adjusting the oscillator signal Fout. The pulse generation circuit 300 can control the average voltage generation circuit 345 and 355 to change the level of voltage signal Vc through the comparison signal P1 and the frequency division signal Fout/N, thereby achieving the effect of controlling and adjusting the oscillator signal Fout.

The present disclosure provides a pulse generation circuit that can have the large frequency ranges. Using the comparator (i.e., the chopped comparator) to compare the reference signal and the pulse signal can reduce or eliminate the effect of the bias voltage on the circuit to improve the stability of the entire circuit. Using the circuit itself to generate the signal to directly control the current source or the voltage source used to operate pulse modulation, can also avoid to increase the power consumption caused by the outer current source or the voltage source, thereby achieving the advantage of low power consumption of the pulse generation circuit. In addition, using a frequency eliminator with an adjustable ratio can also increase the range of the frequency domain of the output for use by more subsequent systems or circuits.

What is claimed is:

1. A pulse generation circuit, comprising:

a reference voltage generator, configured to generate a reference signal;

a pulse generator, configured to generate a pulse signal based on a frequency division signal;

a comparator, configured to receive and compare the reference signal and the pulse signal, and to output a comparison signal, wherein the comparator outputs the comparison signal with a logic low level when a voltage level of the pulse signal has a same voltage level as the reference signal;

a voltage regulator, configured to receive the comparison signal and the frequency division signal, and to output a voltage signal correspondingly;

a voltage-controlled oscillator, configured to receive the voltage signal, and to output an oscillator signal correspondingly; and a frequency divider, configured to generate a frequency division signal based on the oscillation signal.

2. The pulse generation circuit as claimed in claim 1, wherein the reference voltage generator further comprises:

a first resistor, having a first end and a second end, wherein the first end is coupled to a power supply voltage; and a second resistor, coupled between the second end of the first resistor and a ground terminal.

3. The pulse generation circuit as claimed in claim 2, wherein the pulse generator further comprises:

a first switch, having a third end and a fourth end, wherein the third end is coupled to the power supply voltage;

a third resistor, having a fifth end and a sixth end, wherein the fifth end is coupled to the fourth end of the first switch;

a first capacitor, coupled between the sixth end and the ground terminal; and a second switch, coupled between the sixth end and the ground terminal.

4. The pulse generation circuit as claimed in claim 3, wherein the frequency division signal controls the first switch and the second switch to be turned off or turned on, the second switch is turned off when the first switch is turned on, and the first switch is turned off when the second switch is turned on.

5. The pulse generation circuit as claimed in claim 1, wherein the voltage regulator further comprises:

a second capacitor;

a first current source, configured to receive the comparison signal, and when the comparison signal is at a logic high level, the first current source increases a current flowing through the second capacitor; and a second current source, configured to receive the frequency division signal, and when the frequency division signal is at a logic high level, the second current source decreases a current flowing through the second capacitor.

6. The pulse generation circuit as claimed in claim 5, wherein a level of the voltage signal is determined by an intensity of the current flowing through the second capacitor.

7. The pulse generation circuit as claimed in claim 1, wherein the voltage regulator further comprises:

a first average voltage generation circuit, configured to receive the comparison signal and to calculate an average voltage of the comparison signal;

a second average voltage generation circuit, configured to receive the frequency division signal and to calculate an average voltage of the frequency division signal; and a voltage processing circuit, configured to receive the average voltages of the comparison signal and the frequency division signal, and to output the voltage signal correspondingly.

8. The pulse generation circuit as claimed in claim 7, wherein the difference between the average voltage of the comparison signal and the average voltage of the frequency division signal determines a level of the voltage signal.

9. The pulse generation circuit as claimed in claim 1, wherein the comparator is a chopped comparator.

10. The pulse generation circuit as claimed in claim 1, wherein the frequency divider divides the oscillation signal by N times, and N is a positive integer.

* * * * *